(12) United States Patent
Filippi et al.

(10) Patent No.: US 9,761,539 B2
(45) Date of Patent: Sep. 12, 2017

(54) WAFER RIGIDITY WITH REINFORCEMENT STRUCTURE

(71) Applicant: INTERNATIONAL BUSINESS MACHINES CORPORATION, Armonk, NY (US)

(72) Inventors: Ronald G. Filippi, Wappingers Falls, NY (US); Erdem Kaltalioglu, Newburgh, NY (US); Andrew T. Kim, Poughkeepsie, NY (US); Ping-Chuan Wang, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/753,768

(22) Filed: Jun. 29, 2015

(65) Prior Publication Data

US 2016/0379934 A1    Dec. 29, 2016

(51) Int. Cl.
| | | |
|---|---|---|
| *H01L 23/48* | (2006.01) | |
| *H01L 23/00* | (2006.01) | |
| *H01L 21/768* | (2006.01) | |

(52) U.S. Cl.
CPC ...... *H01L 23/562* (2013.01); *H01L 21/76868* (2013.01); *H01L 21/76898* (2013.01); *H01L 23/481* (2013.01)

(58) Field of Classification Search
CPC ............ H01L 23/535; H01L 23/53295; H01L 23/53238; H01L 23/5226
See application file for complete search history.

(56) References Cited

U.S. PATENT DOCUMENTS

| | | |
|---|---|---|
| 4,631,804 A | 12/1986 | Roy |
| 6,025,250 A | 2/2000 | Ha et al. |
| 6,251,790 B1 * | 6/2001 | Jeong ................ H01L 21/76816 257/E21.577 |
| 8,080,106 B2 | 12/2011 | Kihara et al. |
| 8,513,089 B2 | 8/2013 | Chandrasekaran |
| 2011/0121403 A1 * | 5/2011 | Lee ................... H01L 27/11526 257/390 |
| 2013/0099357 A1 | 4/2013 | Dargis et al. |

FOREIGN PATENT DOCUMENTS

EP    1592642 A2    11/2005

* cited by examiner

*Primary Examiner* — Hoa B Trinh
(74) *Attorney, Agent, or Firm* — Anthony Canale; Andrew M. Calderon; Roberts Mlotkowski Safran Cole & Calderson P.C.

(57) ABSTRACT

Reinforcement structures used with a thinned wafer and methods of manufacture are provided. The method includes forming trenches or vias at least partially through a backside of a thinned wafer attached to a carrier wafer. The method further includes depositing material within the trenches or vias to form reinforcement structures on the backside of the thinned wafer. The method further includes removing excess material from a surface of the thinned wafer, which was deposited during the depositing of the material within the vias.

20 Claims, 7 Drawing Sheets

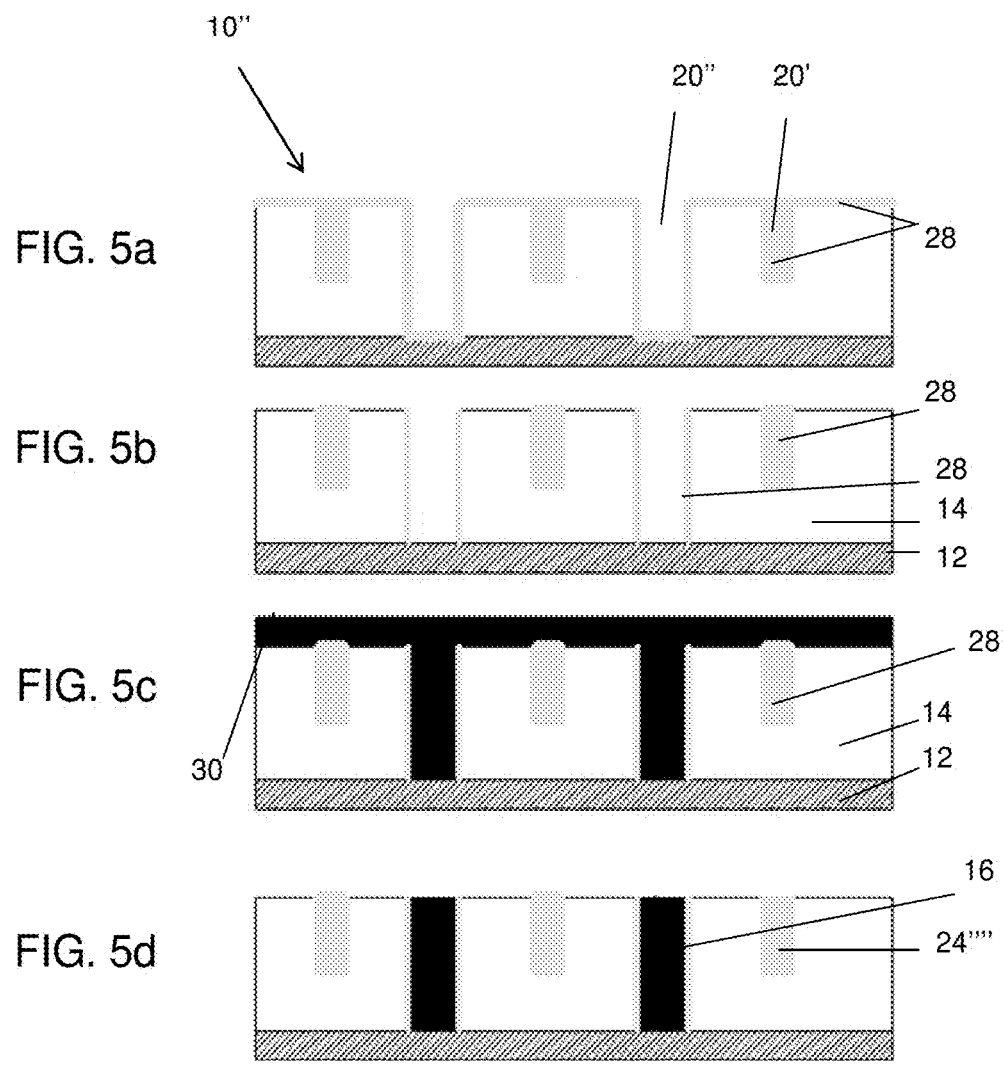

WAFER RIGIDITY WITH REINFORCEMENT STRUCTURE

FIELD OF THE INVENTION

The invention relates to semiconductor structures and, more particularly, to reinforcement structures used with a thinned wafer and methods of manufacture.

BACKGROUND

Chip stacking with TSV technology has been of interest in recent years. In the chip stacking process, the wafer needs be thinned down to 50 μm-200 μm thick for 300 mm Si wafers. However, the coefficient of thermal expansion (CTE) mismatch of different films and temperature cycles during semiconductor processing cause significant wafer bowing, which becomes more significant for thin wafers. That is, CTE mismatch between film and substrate causes significant wafer bowing during process (thermal cycle). Handling and processing thin wafers then becomes extremely challenging.

SUMMARY

In an aspect of the invention, a method comprises forming trenches or vias at least partially through a backside of a thinned wafer attached to a carrier wafer. The method further comprises depositing material within the trenches or vias to form reinforcement structures on the backside of the thinned wafer. The method further comprises removing excess material from a surface of the thinned wafer, which was deposited during the depositing of the material within the trenches or vias.

In an aspect of the invention, a structure comprises: etching trenches or vias partially through a backside of a thinned wafer; etching thru-silicon-vias extending through the backside of the thinned wafer; simultaneously depositing material within the thru-silicon-vias and the trenches or vias, the material deposited within the trenches or vias forming reinforcement structures on the backside of the thinned wafer; and removing excess material from a surface of the thinned wafer, which was deposited during the depositing of the material within the trenches or vias and the thru-silicon-vias.

In an aspect of the invention, a method comprises a structure comprises a plurality of "I" shaped reinforcement structures composed of rigid material on a backside of a thinned wafer.

BRIEF DESCRIPTION OF THE DRAWINGS

The present invention is described in the detailed description which follows, in reference to the noted plurality of drawings by way of non-limiting examples of exemplary embodiments of the present invention.

FIG. 5a shows a thinned wafer with lined thru-silicon-vias and material in trenches or vias and respective fabrication processes in accordance with aspects of the invention.

FIG. 5b shows partially lined thru-silicon-vias and respective fabrication processes in accordance with aspects of the invention.

FIG. 5c shows fill material in the lined thru-silicon-vias and respective fabrication processes in accordance with aspects of the invention.

FIG. 5d shows planarized structure and respective fabrication processes in accordance with aspects of the invention.

DETAILED DESCRIPTION

The invention relates to semiconductor structures and, more particularly, to reinforcement structures used with a thinned wafer and methods of manufacture. In embodiments, the reinforcement structures include, e.g., arrays of joists or I-beam structures on the back side of a thinned wafer. Advantageously, the reinforcement structures will increase rigidity of the thinned wafer and reduce wafer bowing.

More specifically, in embodiments, the reinforcement structures can include an array of joists of different configurations, on the back side of wafer. The structures can be filled with metal or dielectrics materials, with tensile or compressive stress for stress compensation. In embodiments, the material can be, e.g., W and Cu, and tensile or compressive dielectrics such as SiN. In embodiments, air or other material can also be utilized to form the reinforcement structures. The arrangements and density of the reinforcement structures are provided to minimize wafer bowing and can be globally or locally located on the wafer, itself. The reinforcement structures can be fabricated from the back side of thinned wafer with or without pre-existing TSV. In embodiments, the reinforcement structures can be simultaneously formed with the TSV, both of which can be fabricated from the back side of thinned wafer.

Figure 1:
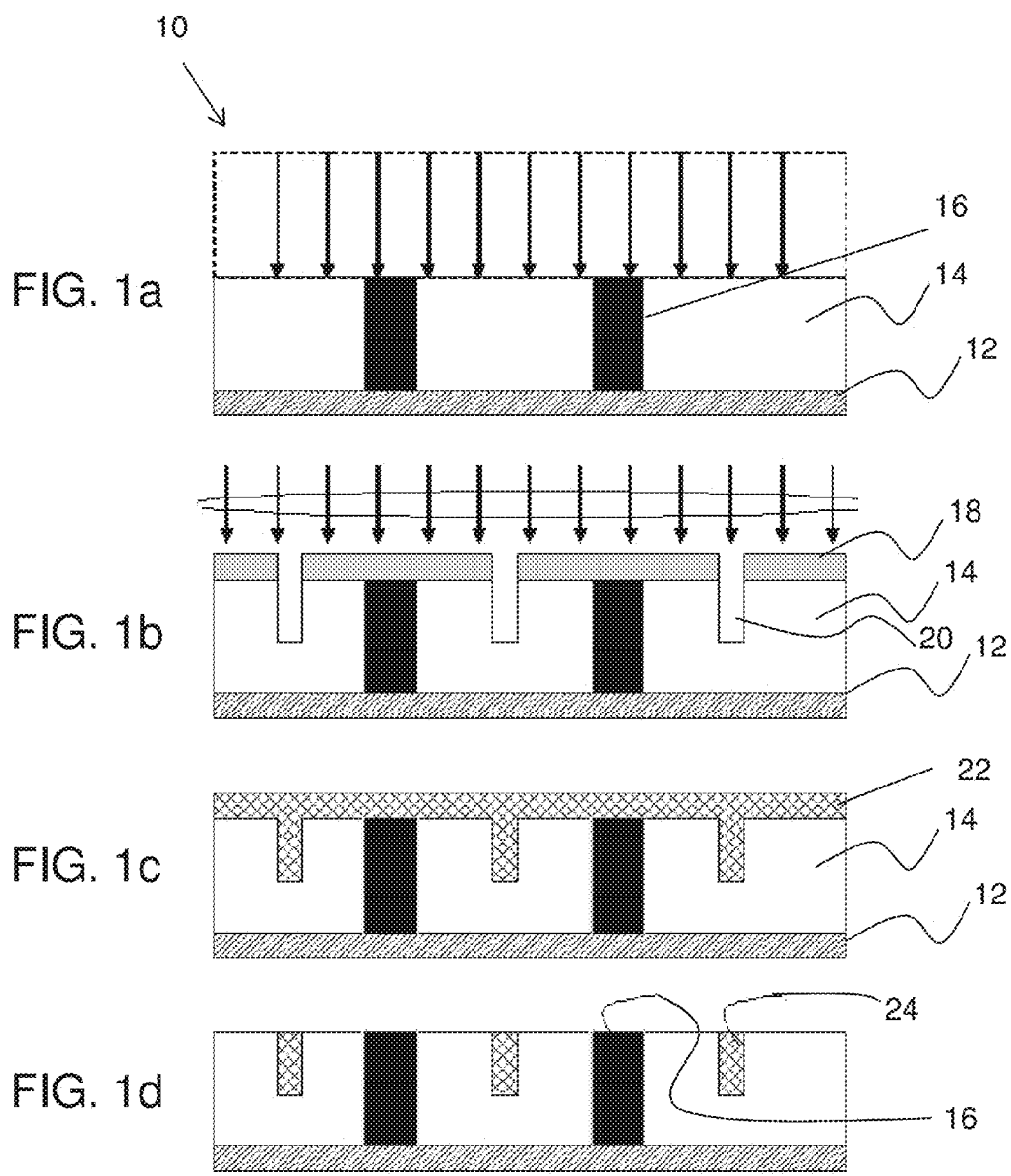
FIG. 1a shows a thinned wafer and respective fabrication processes in accordance with aspects of the invention.
FIG. 1b shows a plurality of trenches or vias and respective fabrication processes in accordance with aspects of the invention.
FIG. 1c shows a deposition of material within the trenches or vias and surface of the thinned wafer and respective fabrication processes in accordance with aspects of the invention.
FIG. 1d shows a planarized structure and respective fabrication processes in accordance with aspects of the invention.

FIGS. 1a-1d show processes forming rigid structures in a wafer and respective structures in accordance with aspects of the present invention. More specifically, FIG. 1a shows a wafer thinning process and respective structure 10 in accordance with aspects of the invention. In particular, the structure 10 includes a back end of the line (BEOL) stack 12 and a substrate or carrier wafer 14. In embodiments, the wafer 14 can be composed of any suitable material including, but not limited to, Si, SiGe, SiGeC, SiC, GE alloys, GaAs, InAs, InP, and other III/V or II/VI compound semiconductors. The wafer 14 can also be silicon on insulator (S 01) or bulk wafer.

In embodiments, the wafer 14 includes a plurality of TSV 16. The plurality of TSV 16 can be formed using conventional lithography, etching and deposition processes, through a backside of the wafer 14. For example, a resist can be formed on the surface of the wafer 14 which is exposed to energy (light) to form a pattern (openings). The wafer 14 then undergoes an etching process through the openings to form vias. The etching process can be a conventional reactive ion etching (RIE), as an example. A conductive material can then be deposited within the vias to form the plurality of TSV 16. In embodiments, a liner material can also be placed in the vias, prior to the deposition of the conductive material. Any excessive material on the backside of the wafer 14 can be removed during the thinning process of the wafer 14. In embodiments, the thinning can be performed by any conventional mechanical grinding process. For example, the wafer 14 is thinned using a grind wheel.

In FIG. 1b, a resist 18 is formed and patterned on the wafer 14 in order to pattern trenches 20 therein. In embodiments, the resist can be formed and patterned on the surface of the wafer 14 as already described herein. After patterning of the resist 18, the wafer 14 undergoes an etching process to form the trenches 20. In embodiments, the trenches 20 are formed partially through the thickness of the wafer 14 in order to not interfere with any circuitry on the wafer; although other depths are also contemplated by the present invention. The etching process can be a conventional RIE process, as an example. Any excess resist can be removed using a conventional oxygen ashing process or other conventional stripping method.

As shown in FIG. 1c, the trenches 20 are filled with a material 22. The material 22 can be, e.g., W and Cu, or tensile or compressive dielectrics such as SiN. In embodiments, the trenches 20 can be filled with a liner, prior to the deposition of the materials. The material 22 can be deposited using conventional deposition methods such as, e.g., chemical vapor deposition (CVD) processes.

In FIG. 1d, any excess material on the surface of the wafer 14 can be removed using conventional chemical mechanical planarization (CMP) processes. In embodiments, the removal of the excessive material will result in the formation of beams or reinforcement structures 24 which provide rigidity to the wafer and which prevents bowing of the structure. In embodiments, the processes of FIG. 1d can be used to pattern the material 22 on the surface of the wafer 14 in order to provide additional support and rigidity, with the TSV 16 being exposed for subsequent solder connection.

Figure 2:
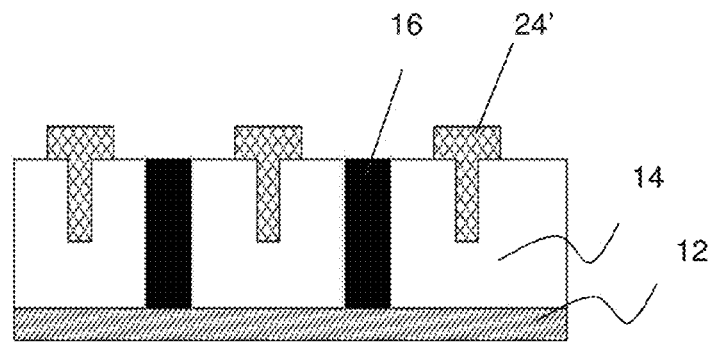
FIG. 2 shows a reinforcement structure and respective fabrication processes in accordance with aspects of the invention.
Figure 3A:
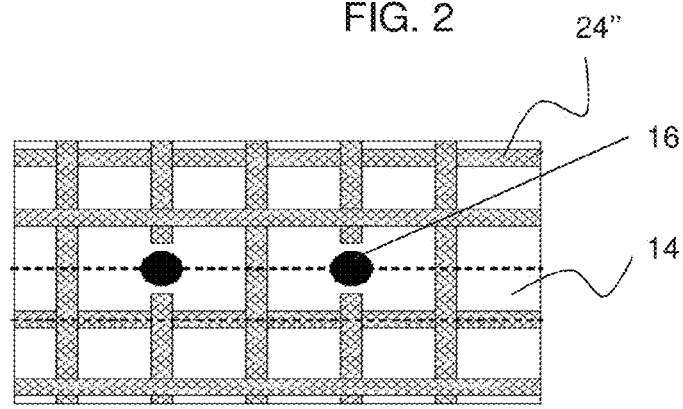
FIG. 3a shows a reinforcement structure and respective fabrication processes in accordance with aspects of the invention.
Figure 3B:
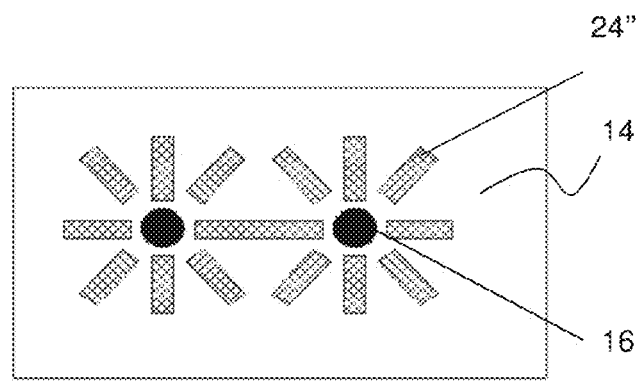
FIG. 3b shows an alternative arrangement of reinforcement structure and respective fabrication processes in accordance with aspects of the invention.
Figure 3C:
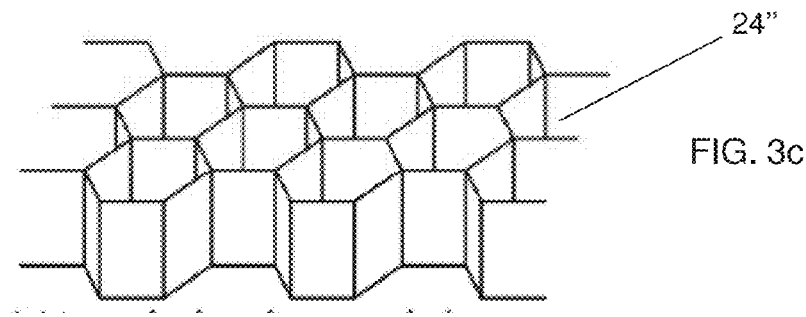
FIG. 3c shows an alternative arrangement of reinforcement structure and respective fabrication processes in accordance with aspects of the invention.

In embodiments, the reinforcement structures can be provided globally or locally in the wafer 14, as well as other configurations described herein. For example, FIG. 2 shows the material patterned in a "T" shape configuration as represented by reference numeral 24'. In FIG. 3a, for example, reinforcement the structures 24" are arranged in a grid pattern spanning the complete surface of the wafer 14 and surrounding the TSV 16. In FIG. 3b, the reinforcement structures 24" are arranged locally about the TSV 16 in a starburst configuration; although other patterns are also contemplated by the present invention. In FIG. 3c, the reinforcement structures 24" are arranged in a honeycomb pattern.

The configurations shown in FIGS. 2, 3a, 3b and 3c can be formed by lithography and etching processes as described herein. For example, a resist can be patterned to expose only a portion of the material 22 which will be removed using a RIE process. Following the RIE process, any resist can be removed in processes already described herein. In still further alternative processes, in any of the embodiments described herein, the material for the reinforcement structures can be air provided in the openings, or the reverse pattern can be provided, e.g., the patterned structure can be the material of the wafer, itself with remaining portions being the material.

Figure 4A:
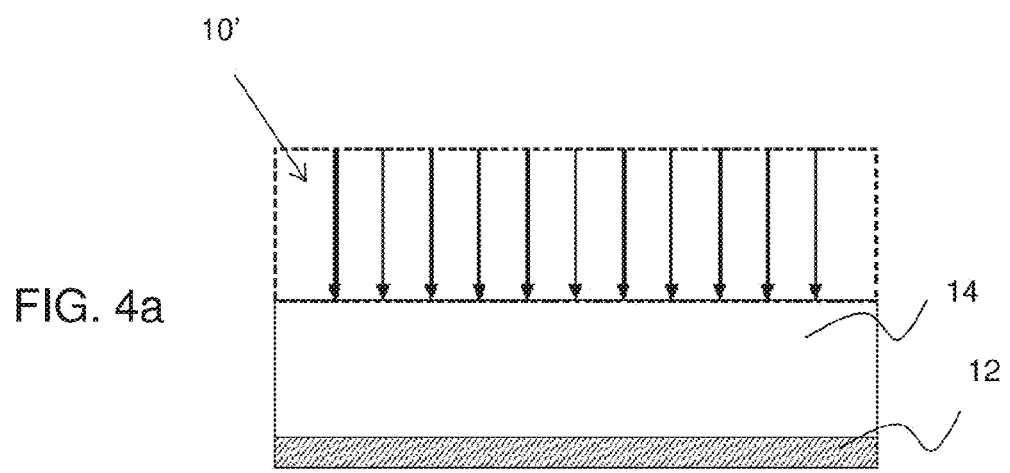
FIG. 4a shows a thinned wafer and respective fabrication processes in accordance with aspects of the invention.

FIGS. 4a-4g show processes forming rigid structures in a wafer and respective structures in accordance with additional aspects of the present invention. More specifically, FIG. 4a shows a wafer thinning process and respective structure in accordance with aspects of the invention. In particular, the structure 10' includes a back end of the line (BEOL) stack on a substrate or wafer 14. In embodiments, the wafer 14 can be composed of any suitable material as already described herein.

Figure 4B:
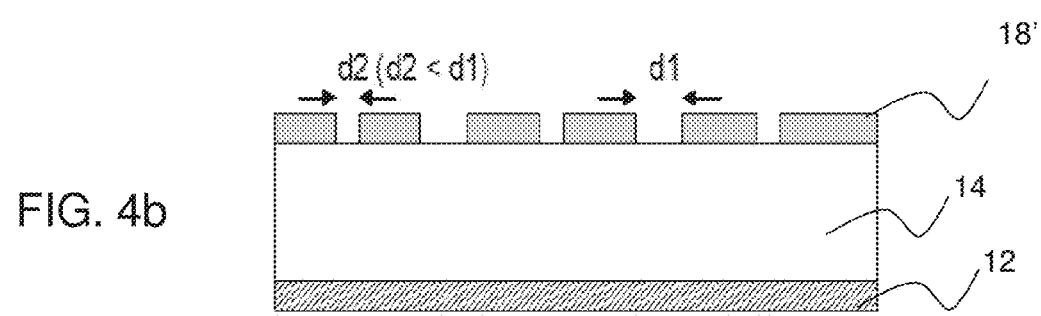
FIG. 4b shows a patterned resist and respective fabrication processes in accordance with aspects of the invention.

In FIG. 4b, a resist 18' is formed on the wafer 14 in order to pattern trenches of different dimensions d1 and d2 (d2<d1). In embodiments, the resist 18' formed on the surface of the wafer is exposed to energy (light) to form a plurality of openings of the same dimensions (e.g., d1 and d2 (d2<d1)).

Figure 4C:
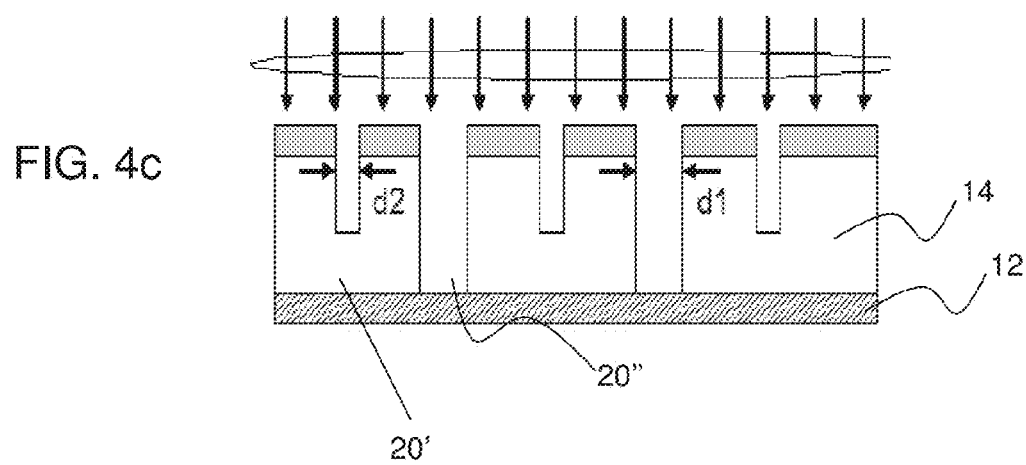
FIG. 4c shows a plurality of trenches or vias and respective fabrication processes in accordance with aspects of the invention.

As shown in FIG. 4c, the wafer 14 then undergoes an etching process to form the trenches 20' and 20". In embodiments, the trenches 20' are formed partially through the thickness of the wafer 14 in order to not interfere with any circuitry on the wafer;

although other depths are also contemplated by the present invention. On the other hand, the trenches 20" are formed through the wafer in order to form TSV in subsequent fabrication processes. In this way, rigid structures and TSV can be formed in a same etching and deposition processes. It should be understood that the trenches 20" will be deeper than the trenches 20' due its larger diameter, e.g., d2<d1. The etching can be a conventional RIE process, as an example. Any excess resist can be removed using a conventional oxygen ashing process or other conventional stripping method.

Figure 4D:
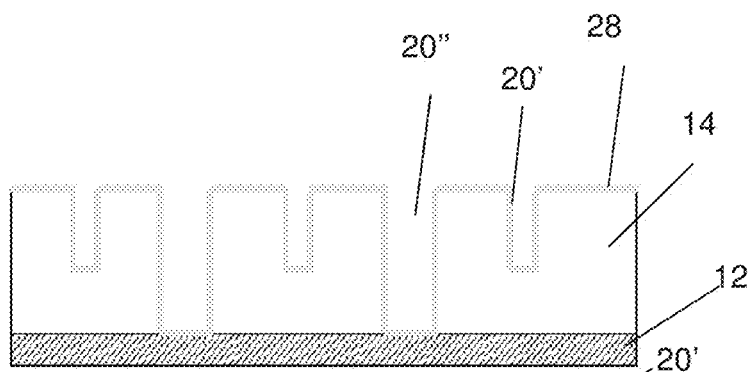
FIG. 4d shows a liner within the trenches or vias and respective fabrication processes in accordance with aspects of the invention.

As shown in FIG. 4d, the trenches 20' and 20" are lined with a material 28. For example, the material 28 can be a dielectric material deposited to a thickness of about 1 micron to about 5 microns, resulting in a lining of the sidewalls of the trenches 20' and 20". The deposition process can be, e.g., CVD.

Figure 4E:
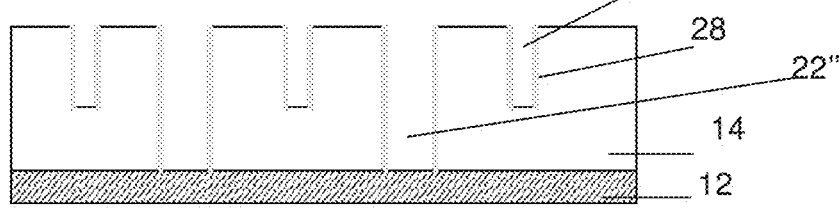
FIG. 4e shows a partially removed liner within the trenches or vias and respective fabrication processes in accordance with aspects of the invention.

In FIG. 4e, the dielectric material 28 can be removed on a bottom of the trenches 20' and 20" using an anisotropic etching process. This etching process will also remove the material from a surface of the wafer 14, leaving material only on sidewalls of the trenches 20' and 20".

Figure 4F:
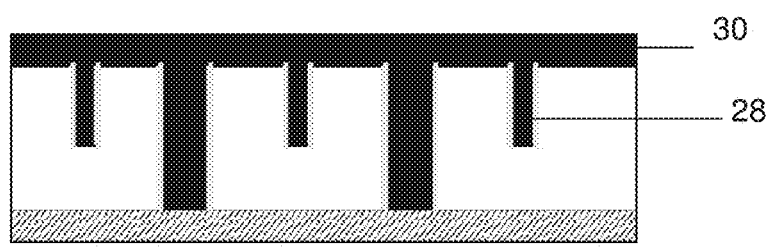
FIG. 4f shows fill material in the lined trenches or vias and respective fabrication processes in accordance with aspects of the invention.
Figure 4G:
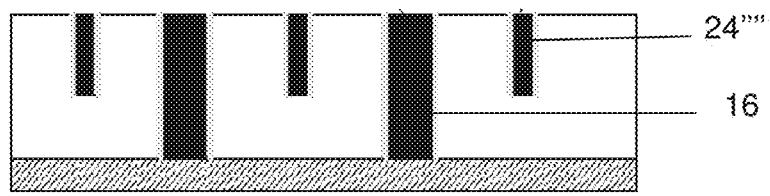
FIG. 4g shows a planarized structure and respective fabrication processes in accordance with aspects of the invention.

As shown in FIG. 4f, a conductive material 30 fills the trenches 20' and 20", over the lining material 28. In embodiments, the conductive material 30 can be deposited using a CVD process, an atomic layer deposition (ALD) process or electroplating processes, as examples. The conductive material 30 can be copper, tungsten, silver or other electrically conductive material In FIG. 4g, any excess material on the surface of the wafer 14 can be removed using a conventional chemical mechanical planarization (CMP) process. In embodiments, the removal of the excessive material will result in the simultaneous formation of a plurality of TSV 16 and reinforcement structures 24''' which provide rigidity to the wafer and which prevents bowing of the structure. In embodiments, the reinforcement structures 24''' can be formed locally or globally as shown and described with respect to, e.g., FIGS. 3a-3c.

FIGS. 5a-5d show alternative processes forming rigid structures in a wafer and respective structures in accordance with additional aspects of the present invention. More specifically, FIG. 5a shows a structure 10" comprising a wafer 14 undergoing an etching process to form the trenches 20' and 20" (similar to that shown in FIGS. 4b and 4c). As already described herein, the trenches 20' are formed partially through the thickness of the wafer 14 in order to not interfere with any circuitry on the wafer; although other depths are also contemplated by the present invention. On the other hand, the trenches 20" are formed through the wafer in order to form TSV. As already described herein, it should be understood that the trenches 20' will be deeper than the trenches 20' due its larger diameter, e.g., d2<d1. The etching can be a conventional reactive ion etching (RIE), as an example. Any excessive resist can be removed using a conventional oxygen ashing process or other conventional stripping method.

As further shown in FIG. 5a, the trenches 20" are lined with a material 28 and the trenches 20' are completely filled with the material 28. In embodiments, the material 28 can be a dielectric material deposited to a thickness of about 5 microns or more, resulting in a lining of the sidewalls of the trenches 20" and filling of the trenches 20'. In specific embodiments, the material 28 can be silicon carbide or silicon nitride or other hardmask material. In further embodiments, the material can be air filling the trenches 20', with or without a lining. The deposition process can be, e.g., CVD.

In FIG. 5b, the material 28 can be removed on a bottom of the trenches 20" using an anisotropic etching process. This etching process will also remove the material from a surface of the wafer 14, leaving material only on sidewalls of the trenches 20" and still filling the trenches 20'.

As shown in FIG. 5c, a conductive material 30 fills the trenches 20", over the lining material 28 on the sidewalls thereof. In embodiments, the conductive material 30 can be deposited using a CVD process, an atomic layer deposition (ALD) process or electroplating process, as examples. The conductive material 30 can be copper, tungsten, silver or other electrically conductive material.

In FIG. 5d, any excess material on the surface of the wafer 14 can be removed using a conventional chemical mechanical planarization (CMP) process. In embodiments, the removal of the excessive material will result in the simultaneous formation of a plurality of TSV 16 and reinforcement structures 24'''' which provide rigidity to the wafer and which prevents bowing of the structure. In embodiments, the reinforcement structures 24'''' can be formed locally or globally as shown in, e.g., FIGS. 3a-3c, or other configurations as described herein.

Figure 6A:
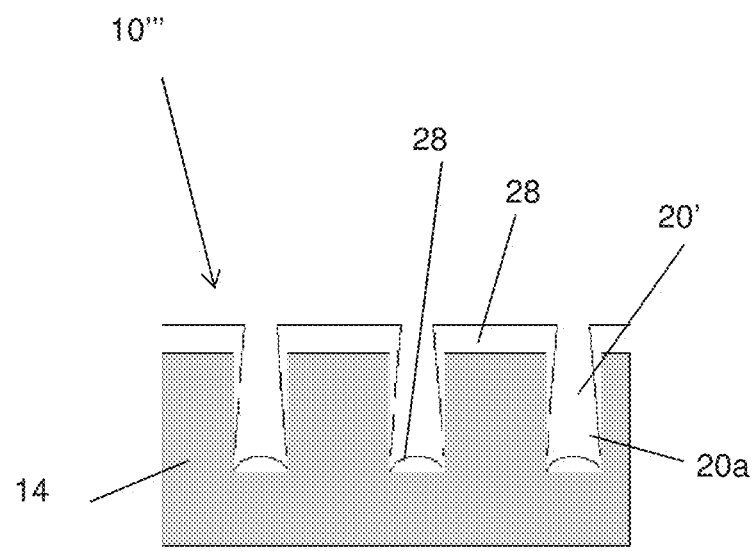
FIG. 6a shows a thinned wafer with a non-conformal liner in trenches or vias and respective fabrication processes in accordance with aspects of the invention.
Figure 6B:
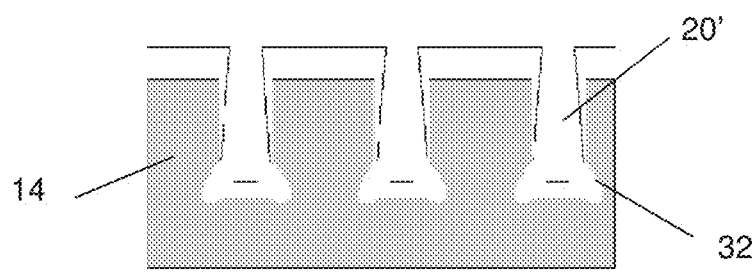
FIG. 6b shows undercuts formed in the thinned wafer and respective fabrication processes in accordance with aspects of the invention.
Figure 6C:
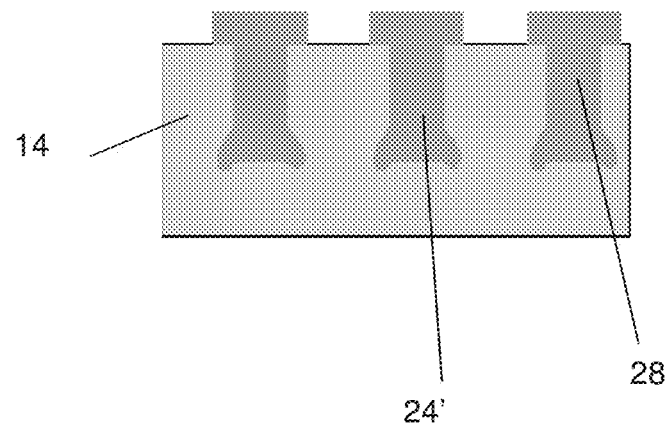
FIG. 6c shows completed reinforcement structures and respective fabrication processes in accordance with aspects of the invention.

FIGS. 6a-6c show alternative processes forming rigid structures in a wafer and respective structures in accordance with additional aspects of the present invention. More specifically, FIG. 6a shows a structure 10''' comprising a wafer 14 undergoing an etching process to form trenches 20'. As already described herein, the trenches 20' are formed partially through the thickness of the wafer 14 in order to not interfere with any circuitry on the wafer; although other depths are also contemplated by the present invention. The trenches 20' are lined with a non-conformal material 28', e.g., a non-conformal hardmask deposition process such as a plasma vapor deposition which has poor sidewall coverage. In this way, portions of the sidewall 20a of the trenches 20''' will remain exposed. Preferably, lower corners of the trenches 20''' may remain exposed.

In FIG. 6b, undercuts 32 are formed in the wafer 14 through the exposed portions of the sidewall 20a of the trenches 20'. In embodiments, the undercuts 32 can be formed using a wet etching process. The hardmask can then be removed using conventional stripping processes.

In FIG. 6c, the trenches 20' are filled with the material 28. In embodiments, the material 28 can be a dielectric material followed by a conductive material, for example. More specifically, the material 28 can be W and Cu, and tensile or compressive dielectrics such as SiN. The deposition process can be, e.g., CVD. As described with respect to FIG. 1d or FIG. 2, the material 28 can be patterned to form the reinforcement structure 24'. In this embodiment, the reinforcement structure 24' can be formed into an "I" shape by the patterning process. Alternatively, the structure 24' can be formed in an inverted "T" shape by removing the material completely from the surface of the wafer 14 (e.g., using a CMP process). Although not shown, the pad and solder connection can be formed using conventional processes using, e.g., ball limiting metallurgy and C4 (controlled collapse chip connection) processes, such that no further explanation is required for one of ordinary skill in the art to understanding the invention.

Figure 7:
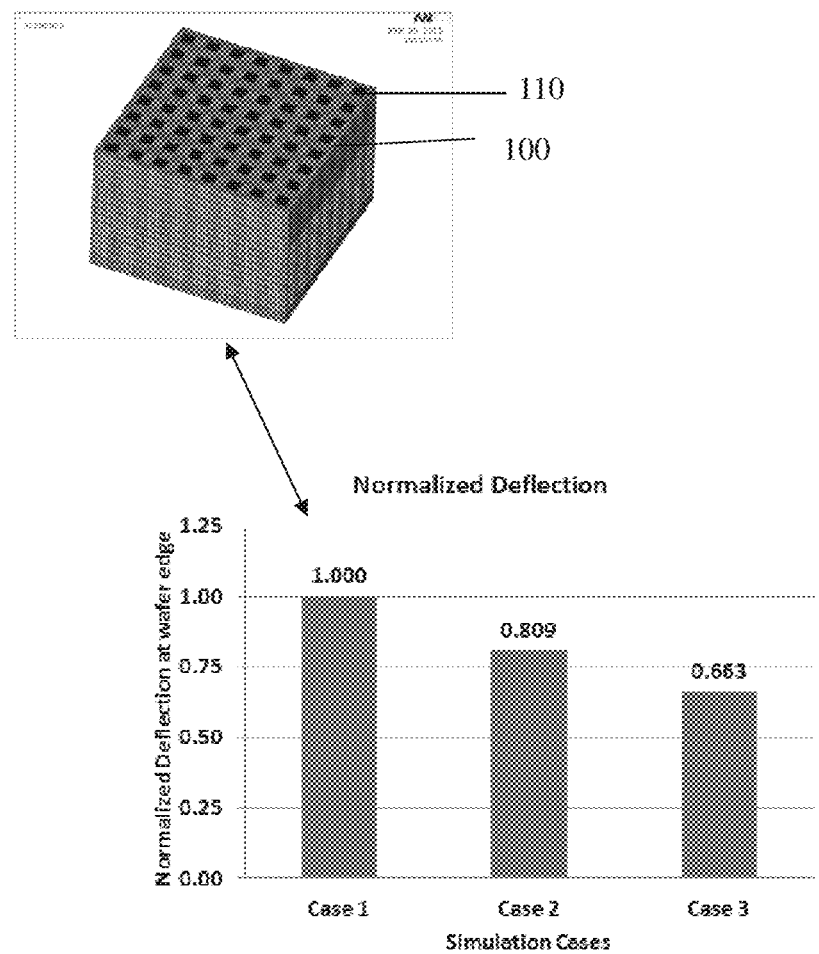
FIG. 7 shows a graph representing the feasibility of different reinforcement structures in accordance with aspects of the invention.

FIG. 7 shows a graph representing the feasibility of different reinforcement structures in accordance with aspects of the invention. In this graph, the y-axis represents a normalized deflection at wafer edge, and the x-axis represents three simulation cases, e.g., case 1, case 2 and case 3. Case 1 represents a conventional structure without any reinforcement structure. As such, the normalized deflection at the wafer edge is shown as 1.000. On the other hand, case 2 and case 3 represent structures in accordance with the present invention, both of which show an improvement in rigidity (e.g., less deflection at the wafer edge) compared to the conventional structure shown in case 1. Case 2, for example, is representative of a grid pattern 100 of silicon with surrounding material 110 therebetween; whereas, case 3 shows a grid pattern 100 of silicon-carbide and surrounding material 110 of silicon.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

The structure(s) and processes as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising a plurality of reinforcement structures composed of rigid material on a backside of a thinned wafer and adjacent to thru-silicon vias,
wherein the thru-silicon vias are deeper than the plurality of reinforcement structures in the thinned wafer, and the thru-silicon vias and the plurality of reinforcement structures are lined with dielectric material with conductive material directly on the dielectric material.

2. The structure of claim 1, wherein the plurality of reinforcement structures are "I" shaped reinforcement structures.

3. The structure of claim 2, wherein the plurality of reinforcement structures are composed of conductive material.

4. The structure of claim 3, wherein the conductive material is lined with liner material.

5. The structure of claim 4, wherein the liner material is dielectric material.

6. The structure of claim 5, wherein the thru-silicon vias are dielectric material.

7. The structure of claim 1, wherein the plurality of reinforcement structures have a cross section smaller than a cross section of the thru-silicon vias.

8. The structure of claim 1, wherein the plurality of reinforcement structures are patterned in a "T" shape.

9. The structure of claim 8, wherein the plurality of "T" shape reinforcement structures comprise a portion formed in trenches or vias and another portion formed on a surface of the thinned wafer.

10. The structure of claim 1, wherein the reinforcement structures are in a grid pattern or honeycomb pattern on the backside of the thinned wafer.

11. The structure of claim 1, wherein the reinforcement structures are locally around the thru-silicon-vias.

12. The structure of claim 1, wherein the plurality of reinforcement structures composed of rigid material are provided partially through the backside of the thinned wafer and adjacent to the thru-silicon vias.

13. The structure of claim 1, wherein the plurality of reinforcement structures are composed of W.

14. The structure of claim 1, wherein the plurality of reinforcement structures are composed of Cu.

15. The structure of claim 1, wherein the plurality of reinforcement structures are composed of tensile or compressive dielectrics.

16. The structure of claim 1, wherein the plurality of reinforcement structures are arranged locally about the thru-silicon vias in a starburst configuration.

17. The structure of claim 1, wherein the plurality of reinforcement structures are composed of air.

18. The structure of claim 1, wherein the thru-silicon vias have a larger diameter than the plurality of reinforcement structures.

19. The structure of claim 1, wherein the plurality of reinforcement structures are completely filled with silicon carbide or silicon nitride.

20. The structure of claim 1, wherein the plurality of reinforcement structures are formed as an inverted "T" shape.

* * * * *